(12) United States Patent
Ito

(10) Patent No.: US 8,390,499 B2
(45) Date of Patent: Mar. 5, 2013

(54) ANALOG-TO-DIGITAL CONVERTER

(75) Inventor: Tomohiko Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 48 days.

(21) Appl. No.: 13/207,114

(22) Filed: Aug. 10, 2011

(65) Prior Publication Data

US 2012/0206287 A1      Aug. 16, 2012

(30) Foreign Application Priority Data

Feb. 15, 2011   (JP) .................................. 2011-30029

(51) Int. Cl.
*H03M 1/36* (2006.01)
(52) U.S. Cl. ........................ 341/159; 341/155
(58) Field of Classification Search .................. 341/155, 341/159
See application file for complete search history.

(56) References Cited

U.S. PATENT DOCUMENTS

| 4,270,118 | A | * | 5/1981 | Brokaw | ........................ 341/159 |
| 4,987,417 | A | * | 1/1991 | Buckland | ...................... 341/159 |
| 5,734,342 | A | * | 3/1998 | Mes | .............................. 341/159 |
| 5,936,566 | A | | 8/1999 | Park | |

FOREIGN PATENT DOCUMENTS

WO    2009/095349 A1    8/2009

* cited by examiner

*Primary Examiner* — Khai M Nguyen
(74) *Attorney, Agent, or Firm* — Holtz, Holtz, Goodman & Chick, PC

(57) ABSTRACT

An analog-to-digital converter includes an input terminal, a first comparator, a first output terminal, a second comparator, and a second output terminal. The first comparator generates a first logical signal and a control signal by comparing an input signal received by the input terminal with a first reference signal. A first transistor generates a first current based on the input signal. First and second switches are switched so as to be short-circuited/open-circuited in an opposite manner to each other based on the control signal. A second transistor supplies a second current based on a second reference signal to a terminal when the first switch is ON. A third transistor supplies a third current based on a third reference signal to the terminal when the second switch is ON. An output unit generates a second logical signal by comparing the first current with one of the second and the third currents.

11 Claims, 15 Drawing Sheets

ANALOG-TO-DIGITAL CONVERTER

CROSS REFERENCE TO RELATED APPLICATIONS

This application is based upon and claims the benefit of priority from the prior Japanese Patent Application No. 2011-30029, filed on Feb. 15, 2011, the entire contents of which are incorporated herein by reference.

FIELD

The embodiments of the present invention relate to an analog-to-digital converter, and for example, to an analog-to-digital converter with small input capacitance.

BACKGROUND

Conventional binary-search analog-to-digital converters use an algorithm to gradually bring a reference signal of a comparator closer to an input analog signal by comparison based on a binary search in a similar manner to SAR analog-to-digital converters. Fewer comparators are operated therein as compared to flash analog-to-digital converters in which comparators of the same number as the desired number of bits and having different reference signals from each other are connected in parallel to each other and all the comparators are operated in a single comparison operation. Thus, power consumption can be reduced.

In a similar manner to the flash analog-to-digital converters, in the binary-search analog-to-digital converters, comparators of the same number as the desired number of bits and having constant reference voltages are prepared in advance. Based on a comparison result of a higher bit, a comparator having a reference signal close to an input signal for use in comparison of the next bit is selected. Since the reference voltage of each comparator has a constant value before being selected, a time for regulating a threshold voltage by feeding back the comparison result of the higher bit is not required. Thus, the binary-search analog-to-digital converters can be operated at higher speed than the SAR analog-to-digital converters.

In the conventional binary-search analog-to-digital converters, analog signal input terminals of all the comparators are short-circuited.

A buffer circuit such as a source-follower circuit and a sample-hold circuit is normally added to a position frontward of an analog-to-digital converter to ensure resolution. By adding the buffer circuit, an output impedance is reduced to a desired value. The accuracy of an analog signal input into a comparator can be thereby maintained within a desired signal band.

Generally, when the output load capacitance of the buffer circuit increases, the output impedance of the buffer circuit needs to be reduced corresponding thereto. The buffer circuit thereby consumes more power. In the aforementioned conventional technique, the analog signal input terminals of the comparators of the same number as that in the flash analog-to-digital converter are short-circuited. Thus, when the number of bits of the analog-to-digital converter is increased, the number of comparators is also exponentially increased. Along with the increase in the number of comparators, the parasitic capacitance of the analog signal input terminals increases. A wiring for short-circuiting the comparators is also extended, so that the wiring parasitic capacitance also increases. There is a disadvantage that the buffer circuit consumes more power as the parasitic capacitance increases.

As described above, the conventional binary-search analog-to-digital converters have a problem that when the number of comparators is increased to increase the number of bits, the parasitic capacitance of the analog signal input terminals becomes larger, so that the buffer circuit connected to a position frontward thereof consumes more power.

DETAILED DESCRIPTION

According to an aspect of the embodiments, there is provided an analog-to-digital converter including an input terminal, a first comparator, a first output terminal, a second comparator and a second output terminal.

The input terminal receives an input signal.

The first comparator generates a first logical signal and a control signal by comparing the input signal with a first reference signal.

The first output terminal outputs the first logical signal.

The second comparator generates a second logical signal based on the input signal, a second reference signal, a third reference signal, and the control signal.

The second output terminal outputs the second logical signal.

The second comparator includes a terminal, a first transistor, a first switch, a second switch, a second transistor, a third transistor and an output unit.

The first transistor generates a first current based on the input signal.

The first switch is short-circuited and open-circuited according to the control signal.

The second switch is switched so as to be short-circuited and open-circuited in an opposite manner to the first switch according to the control signal.

The second transistor supplies a second current based on the second reference signal to the terminal when the first switch is ON.

The third transistor supplies a third current based on the third reference signal to the terminal when the second switch is ON.

One end of the first switch is connected to the terminal, one end of the second switch is connected to the terminal, one end of the second transistor is connected to the other end of the first switch, and one end of the third transistor is connected to the other end of the second switch.

The output unit generates the second logical signal by comparing the first current with one of the second current and the third current supplied to the terminal.

In the following, embodiments of the present invention will be described in detail by reference to the drawings.

First Embodiment

Figure 1:
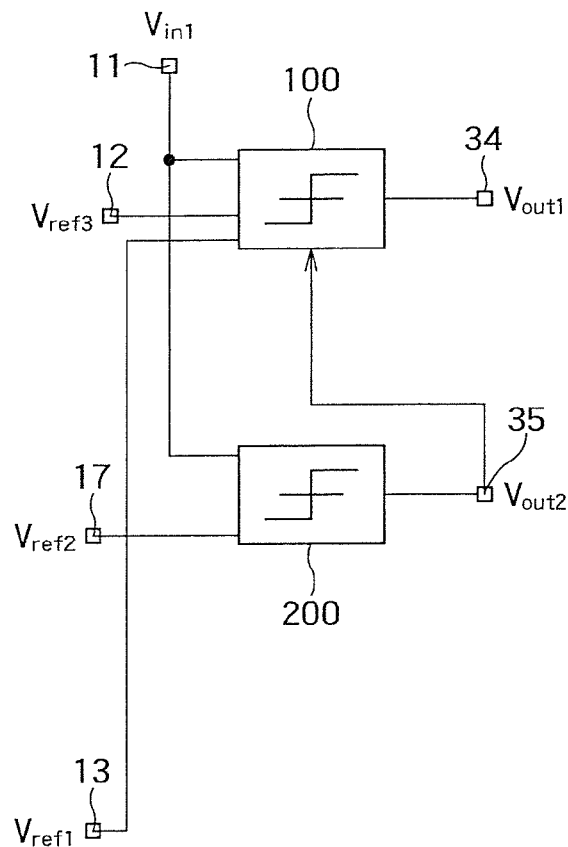
FIG. 1 is a circuit block diagram of an analog-to-digital converter circuit according to a first embodiment.

FIG. 1 is a circuit block diagram of a binary-search analog-to-digital converter circuit according to a first embodiment.

A comparator 100 includes input terminals 11 to 13, and an output terminal 34. An analog signal "Vin1" is input into the input terminal 11. Reference signals "Vref1" and "Vref3" are respectively input into the input terminals 12 and 13.

A comparator 200 includes the input terminal 11, an input terminal 17, and an output terminal 35. The input terminal 11 into which "Vin1" is input is short-circuited with the comparator 100. A reference signal "Vref2" is input into the input terminal 17.

An input range of "Vin" is set to −Vr to Vr(Vr>0), Vref1=−Vr/2, Vref2=0, and Vref3=Vr/2. The reference voltages "Vref1" to "Vref3" can be generated by a reference voltage generating circuit in FIG. 2, for example. In an example shown in FIG. 2, the reference voltages "Vref1" to "Vref3" are generated by a resistor series having a given resistance value R.

The comparator 200 corresponds to a first comparator, and the comparator 100 corresponds to a second comparator. The output terminal 35 corresponds to a first output terminal, and the output terminal 34 corresponds to a second output terminal.

The comparator 200 outputs a voltage representing a logical value "High" in a case of Vin1>=Vref2, and a voltage representing a logical value "Low" in a case of Vin1<Vref2 from the output terminal 35 as a voltage "Vout2". The voltage "Vout2" works as a first logical signal having information of the higher bit out of 2 bits, and a control signal against the comparator 100. Although the control signal is a signal having the same contents as the first logical signal in the present embodiment, the control signal may be a signal having different contents from the first logical signal.

Figure 3:
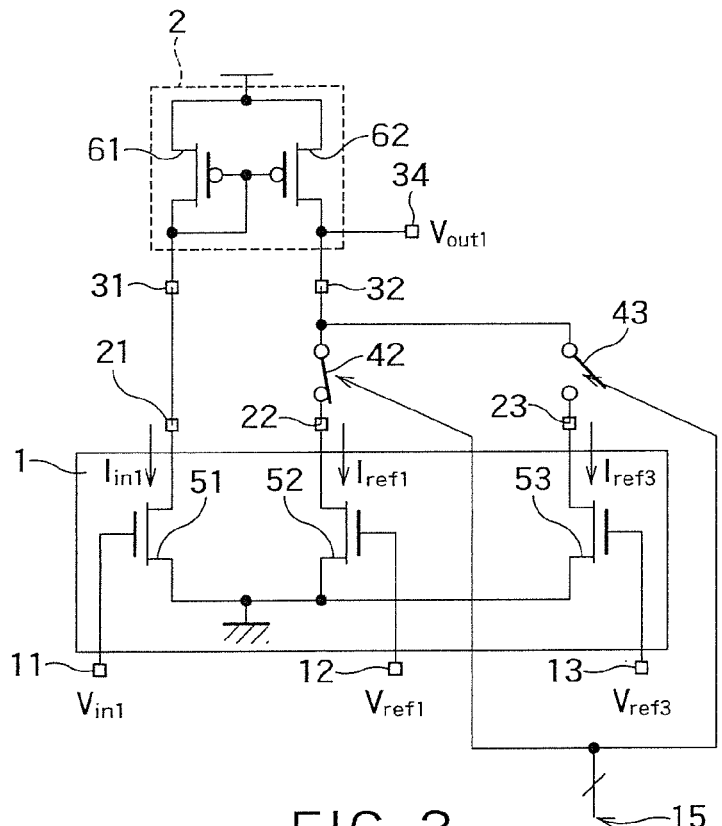
FIG. 3 is a circuit diagram of a comparator according to the first embodiment.

FIG. 3 shows an example of a circuit configuration of the comparator 100. The comparator 100 includes an input unit 1, input terminals 31 and 32, the output terminal 34, a switch 42 connected between an output terminal 22 and the input terminal 32, a switch 43 connected between an output terminal 23 and the input terminal 32, and a control signal 15. The input unit 1 includes the input terminals 11 to 13, output terminals 21 to 23, and NMOS transistors 51 to 53.

The switch 42 corresponds to a first switch, and the switch 43 corresponds to a second switch. The NMOS transistor 51 corresponds to a first transistor, the NMOS transistor 52 a second transistor, and the NMOS transistor 53 a third transistor.

The signal voltages "Vin1", "Vref1", and "Vref3" input from the input terminals 11 to 13 are respectively input into gate terminals of the transistors 51 to 53 in advance. Source terminals of the transistors 51 to 53 are connected to a ground potential. Thus, drain currents "Iin1", "Iref1", and "Iref3" of the transistors 51 to 53 monotonically increase with respect to the magnitudes of the gate voltages "Vin1", "Vref1", and "Vref3". "Iin1", "Iref1", and "Iref3" are respectively output from the output terminals 21 to 23.

Figure 4:
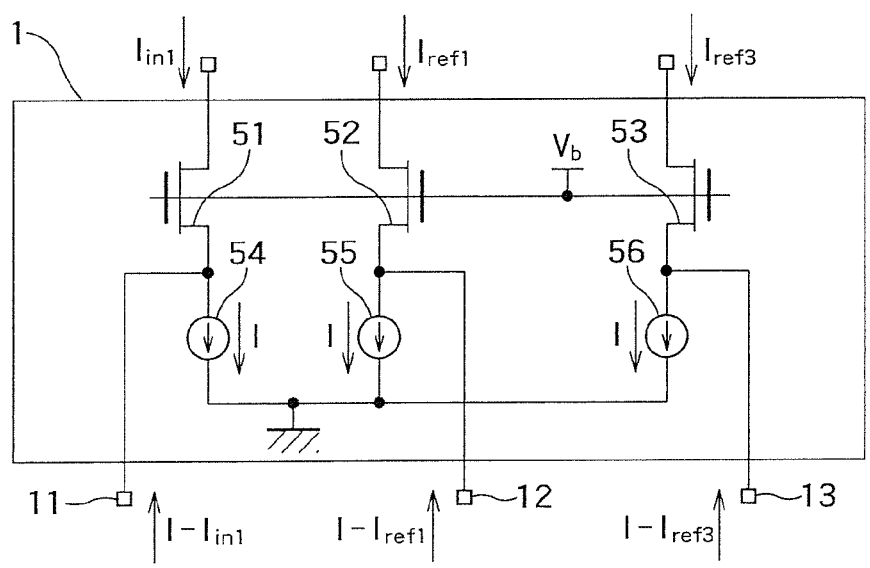
FIG. 4 is a view illustrating a circuit configuration example of an input unit of the comparator according to the first embodiment.

In the input unit 1, the input signal may be a current as shown in FIG. 4, for example. Inverse signal currents "I-Iin1", "I-Iref1", and "I-Iref3" input from the input terminals 11, 12 and 13 are respectively input into the source terminals of the transistors 51, 52 and 53 in advance. Constant-current sources 54 to 56 that apply a constant current I are respectively connected to the source terminals of the transistors 51, 52 and 53. The respective source terminals are connected to the ground (a predetermined potential) via the constant-current sources 54 to 56. The gate terminals of the transistors 51 to 53 are connected to a constant voltage "Vb".
Currents "Iin1", "Iref1", and "Iref3" corresponding to respective differences between the currents I of the constant-current sources and the inverse input signal currents "I-Iin1", "I-Iref1", and "I-Iref3" are respectively output from the output terminals 21, 22 and 23. The constant-current source 55 corresponds to a first constant-current source, and the constant-current source 56 corresponds to a second constant-current source.

The current is input into the input terminal 31 from the output terminal 21. When the switch 42 is short-circuited, the current is input into the input terminal 32 from the output terminal 22. When the switch 43 is short-circuited, the current is input into the input terminal 32 from the output terminal 23. An output unit 2 outputs a voltage representing a logical value "High" when the current from the input terminal 31 is larger than the current from the input terminal 32, and a voltage representing a logical value "Low" when the current from the input terminal 31 is smaller than the current from the input terminal 32 from the output terminal 34 as a voltage "Vout1" (a second logical signal).

The output unit 2 includes PMOS transistors 61 and 62 having the same size as each other, for example. Source terminals of the PMOS transistors 61 and 62 are connected to a power supply potential. Drain terminals thereof are respectively connected to the input terminals 31 and 32. Gate terminals thereof and the drain terminal of the PMOS transistor 61 are short-circuited with each other. A drain current of the PMOS transistor 62 is equal to the input current "Iin1" from the input terminal 21 by the connection. When "Iin1" is larger than the input current from the input terminal 32, the voltage "Vout1" of the output terminal 34 becomes close to a power supply voltage to represent the logical value "High". When the input current "Iin1" is smaller than the input current from the input terminal 32, the voltage "Vout1" of the output terminal 34 becomes close to a ground voltage to represent the logical value "Low".

One end of the switch 42 is connected to the terminal 32. The other end of the switch 42 is connected to one end of the transistor 52. Similarly, one end of the switch 43 is connected to the terminal 32. The other end of the switch 43 is connected to one end of the transistor 53.

Switching (short-circuit/open-circuit) of the switches 42 and 43 is determined by the control signal 15. The control signal 15 is defined by the output signal "Vout2" from the output terminal 35 of the comparator 200. When "Vout2" represents "High", the switch 42 is open-circuited, and the switch 43 is short-circuited. When "Vout2" represents "Low", the switch 42 is short-circuited, and the switch 43 is open-circuited. That is, the switch 42 is switched so as to be short-circuited/open-circuited in an opposite manner to the switch 43.

Figure 5:
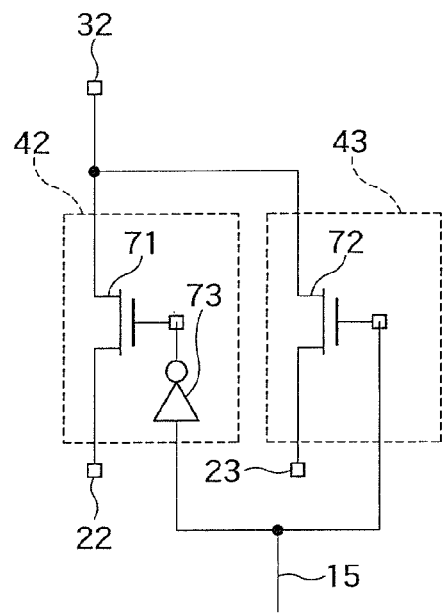
FIG. 5 is a view illustrating a configuration example 1 of a control signal and a switch of the comparator according to the first embodiment.

For example, as shown in FIG. 5, the switch 42 includes an NMOS transistor 71 and an inverter 73. The switch 43 includes an NMOS transistor 72. The output signal "Vout2" from the output terminal 35 of the comparator 200 is input into an input of the inverter 73 and a gate terminal of the NMOS transistor 72 as the control signal 15. The above operation may be thereby achieved.

Figure 6:
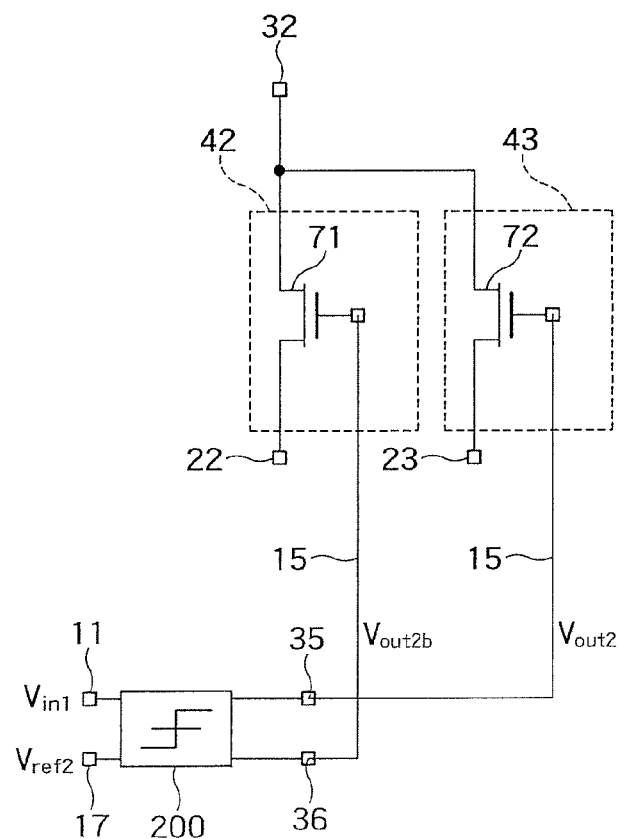
FIG. 6 is a view illustrating a configuration example 2 of the control signal and the switch of the comparator according to the first embodiment.

Also, as shown in FIG. 6, the switches 42 and 43 respectively include the NMOS transistors 71 and 72. The comparator 200 is operated in a differential output mode. "Vout2" of a non-inverted output 35 and "Vout2b" of an inverted output 36 are respectively input into a gate terminal of the switch 43 and a gate terminal of the switch 42. The above operation may be thereby achieved.

Figure 7:
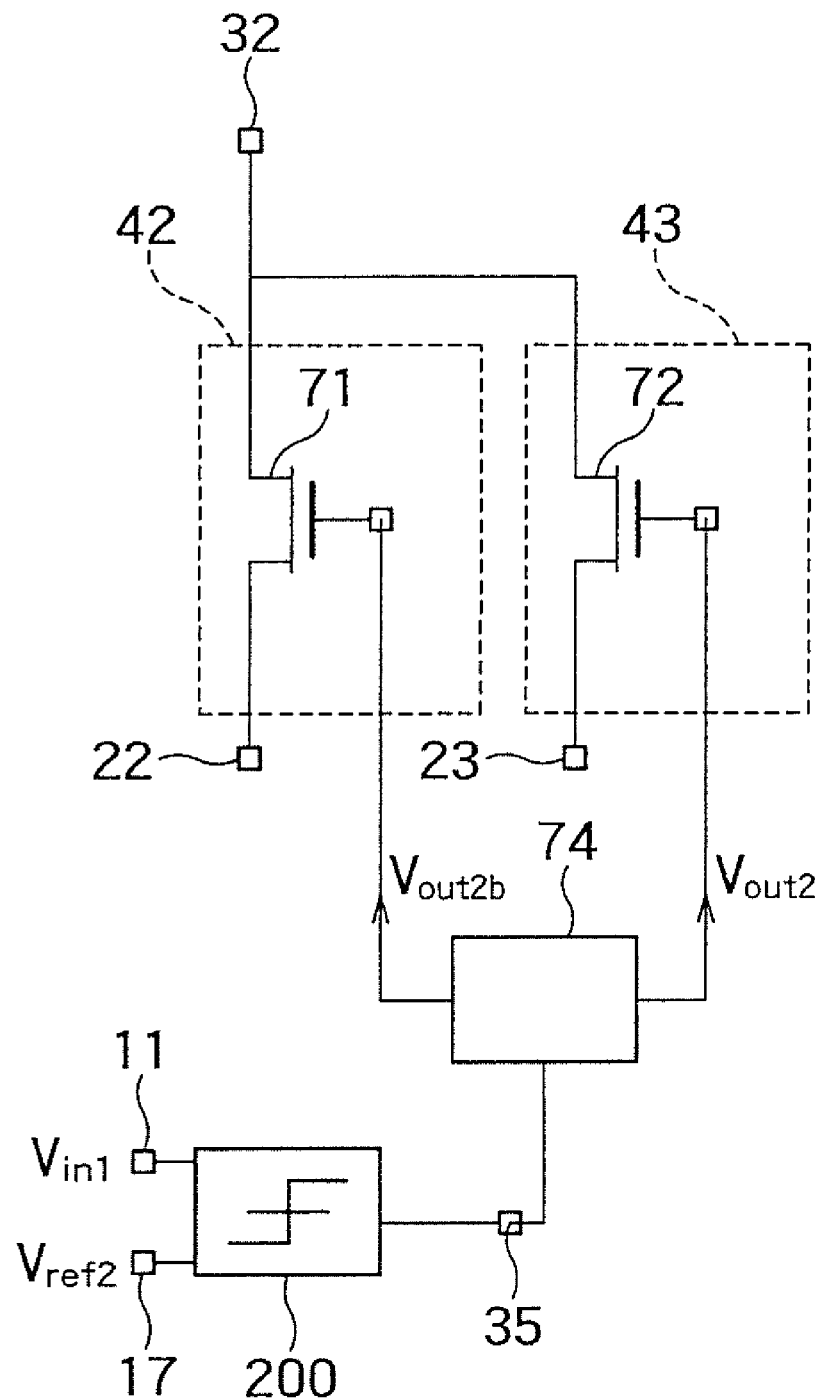
FIG. 7 is a view illustrating a configuration example 3 of the control signal and the switch of the comparator according to the first embodiment.

Also, as shown in FIG. 7, a control signal generating circuit 74 may be added to a position rearward of the output terminal 35 of the comparator 200, to thereby generate "Vout2" and "Vout2b". A switch driving buffer may be also included in the control signal generating circuit 74. By adding the buffer, the operating speed of the comparator 200 can be prevented from being reduced due to an increase in the load capacitance of the comparator 200 resulting from the gate capacitance of the NMOS transistors 71 and 72.

The analog-to-digital converter according to the present embodiment is operated as described below. For example, "Vin1" is set such that 0<=Vin1<Vr/2. First, the comparator 200 is operated. Since Vin1>Vref2=0, the voltage "Vout2" representing the logical value "High" is output from the output terminal 35. The "Vout2" is input into the comparator 100 as the control signal 15, so that the switch 42 is open-circuited, and the switch 43 is short-circuited. "Iref3" is input into the input terminal 32 of the comparator 100. Since Vin1<Vr/2, Iin1<Iref3. The comparator 100 outputs the voltage "Vout1" representing the logical value "Low". As a result, a 2-bit digital signal "10" having "Vout2" as the higher bit and "Vout1" as the lower bit is output.

Similarly, when "Vin1" is set such that −Vr<=Vin1<−Vr/2, a digital signal "00" is output. When "Vin1" is set such that −Vr/2<=Vin1<0, a digital signal "01" is output. When "Vin1" is set such that Vr/2<=Vin1<=Vr, a digital signal "11" is output.

Through the above process, the input analog signal "Vin1" is converted into a digital signal, and output.

Figure 8:
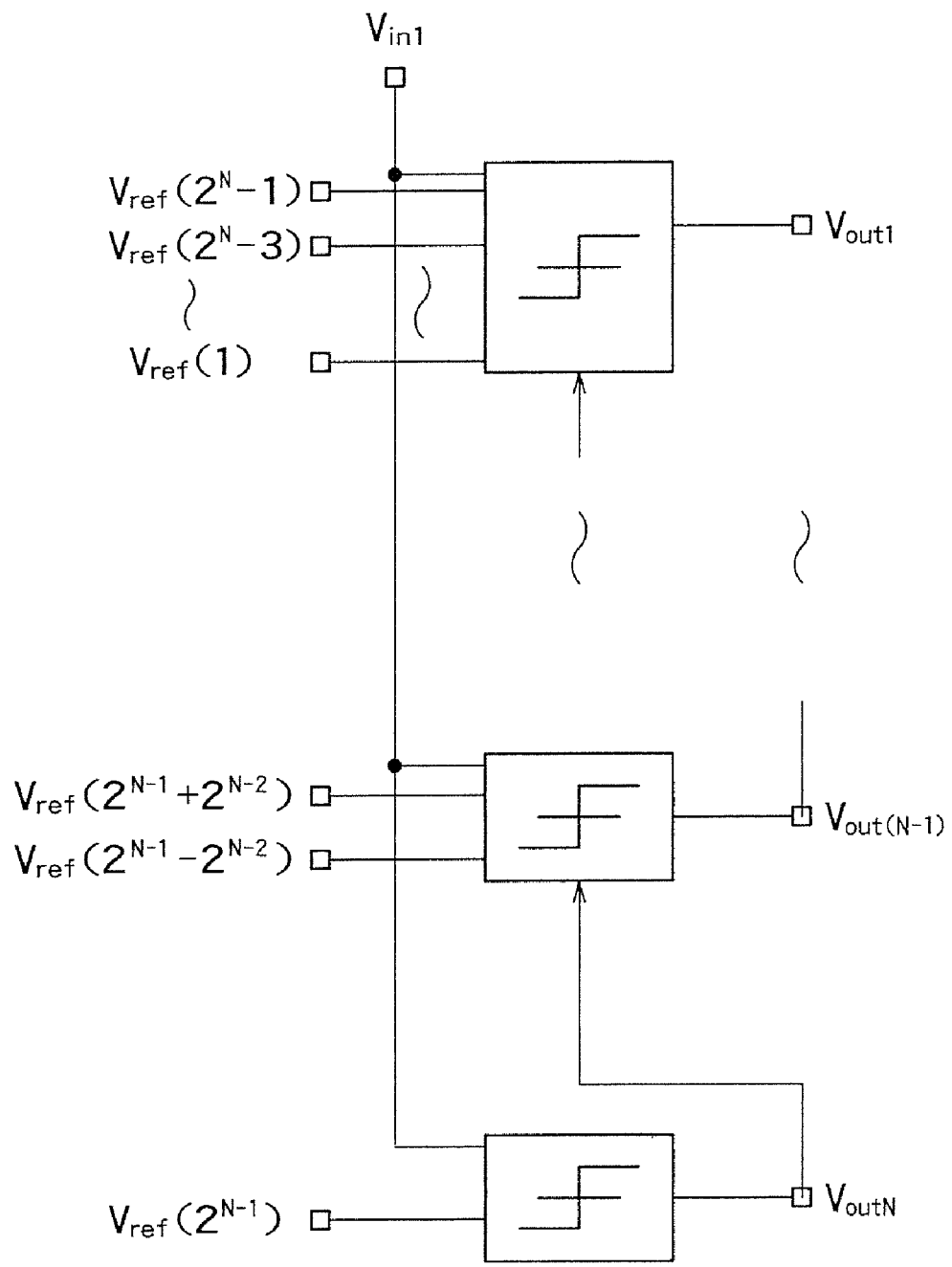
FIG. 8 is a view illustrating a configuration example of comparators corresponding to N bits.
Figure 9:
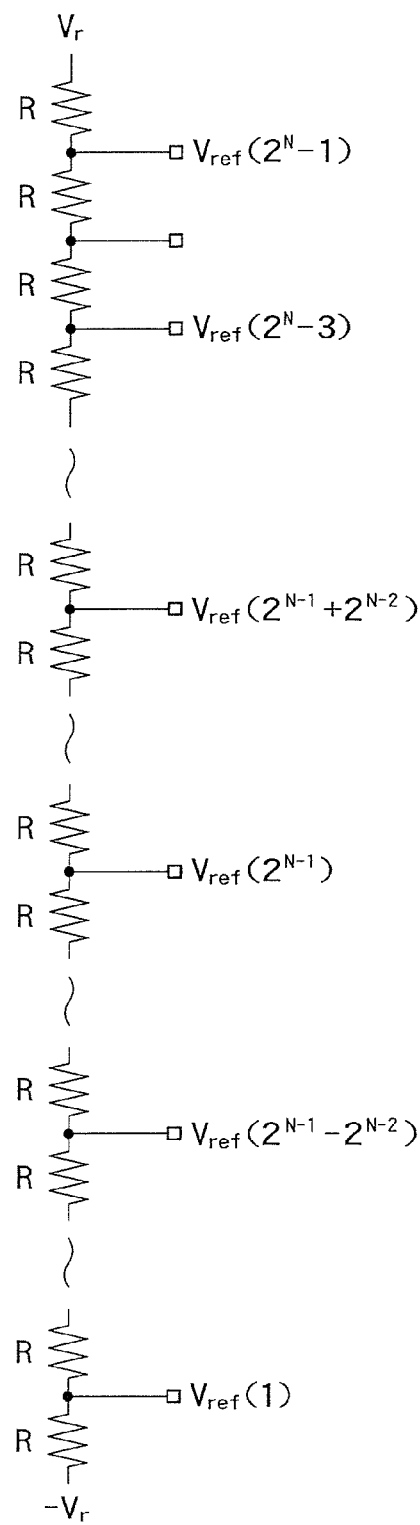
FIG. 9 is a view illustrating a configuration example of reference voltage generating circuits corresponding to N bits.

Although the case in which the number of bits is two is described above, the present embodiment may be also applied to a bit number N. In this case, a binary-search analog-to-digital converter having a configuration shown in FIG. 8, and a reference voltage generating circuit having a configuration shown in FIG. 9 may be used. As shown in FIG. 8, as the number of bits is increased, the number of comparators is increased one by one, and the number of reference signals is also increased one by one. Since the configuration and operation of the converter shown in FIG. 8 is obvious from the above description, the detailed description thereof is omitted.

According to the present embodiment described above, the following advantages are obtained.

In the binary-search analog-to-digital converter according to the present embodiment, there are two comparators which are connected to the input terminal 11 into which the analog input signal "Vin1" is input as shown in FIG. 1. Meanwhile, the number of reference voltages used is three. In a normal binary-search analog-to-digital converter, three comparators are configured to be connected to the input terminal 11 in a similar manner to a flash analog-to-digital converter. Accordingly, in the binary-search analog-to-digital converter proposed herein, the number of comparators connected to the input terminal 11 can be reduced. The load capacitance of a buffer circuit at a frontward position can be thereby reduced, so that the buffer circuit consumes less power.

Figure 2:
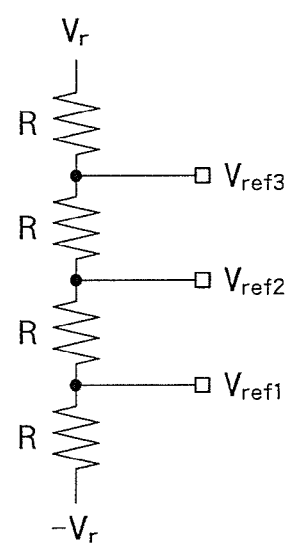
FIG. 2 is a circuit diagram of a reference voltage generating circuit according to the first embodiment.

When the switch 42 or the switch 43 of the comparator 100 is selected, the reference voltages "Vref1" and "Vref3" input into the input terminals 12 and 13 from the reference voltage generating circuit in FIG. 2 are constant. Therefore, a time for regulating the reference voltage is not required (a problem that it takes time until the reference voltage becomes stable is eliminated). The binary-search analog-to-digital converter can be thereby operated at higher speed than an SAR analog-to-digital converter in a similar manner to the conventional binary-search analog-to-digital converter.

Second Embodiment

Figure 10:
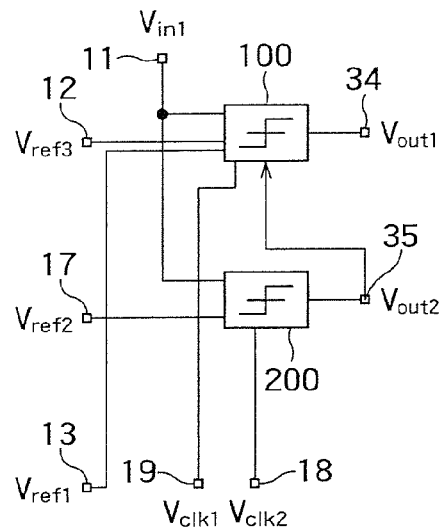
FIG. 10 is a block diagram of an analog-to-digital converter circuit according to a second embodiment.

FIG. 10 is a circuit block diagram of a binary-search analog-to-digital converter according to a second embodiment. As compared to the first embodiment shown in FIG. 1, clock input terminals 19 and 18 are respectively added to the comparators 100 and 200. The comparators 100 and 200 are operated in synchronization with clocks "Vclk1" and "Vclk2" input into the clock input terminals 19 and 18. The clock "Vclk1" corresponds to a second external clock, and the clock "Vclk2" corresponds to a first external clock.

The comparator 200 compares the magnitudes of the input signal "Vin1" and the reference signal "Vref2" when "Vclk2" is "High". The comparator 200 outputs "High" when Vin1>=Vref2, and "Low" when Vin1<Vref2 as the voltage "Vout2". When "Vclk2" is "Low", "Vout2" is reset.

Figure 11:
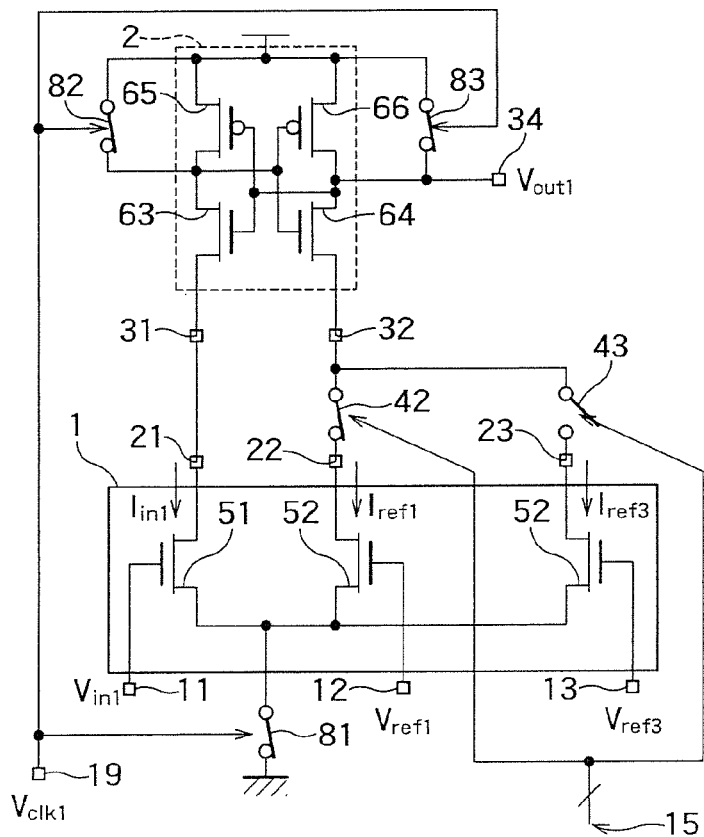
FIG. 11 is a circuit diagram of a comparator according to the second embodiment.

FIG. 11 is a circuit diagram of the comparator 100 of the binary-search analog-to-digital converter according to the second embodiment. A switch 81 is added between the source terminals of the NMOS transistors 51 to 53 and the ground potential. The output unit 2 includes NMOS transistors 63 and 64, and PMOS transistors 65 and 66. Source terminals of the PMOS transistors 65 and 66 are connected to the power supply potential.

A gate terminal of the NMOS transistor 63, a gate terminal of the PMOS transistor 65, a drain terminal of the NMOS transistor 64, and a drain terminal of the PMOS transistor 66 are short-circuited with each other. A gate terminal of the NMOS transistor 64, a gate terminal of the PMOS transistor 66, a drain terminal of the NMOS transistor 63, and a drain terminal of the PMOS transistor 65 are also short-circuited with each other.

Source terminals of the NMOS transistors 63 and 64 are respectively connected to the input terminals 31 and 32. The output terminal 34 is short-circuited with the drain terminal of the PMOS transistor 66. Switches 82 and 83 are connected between the power supply potential and the drain terminals of the PMOS transistors 65 and 66.

Figure 12:
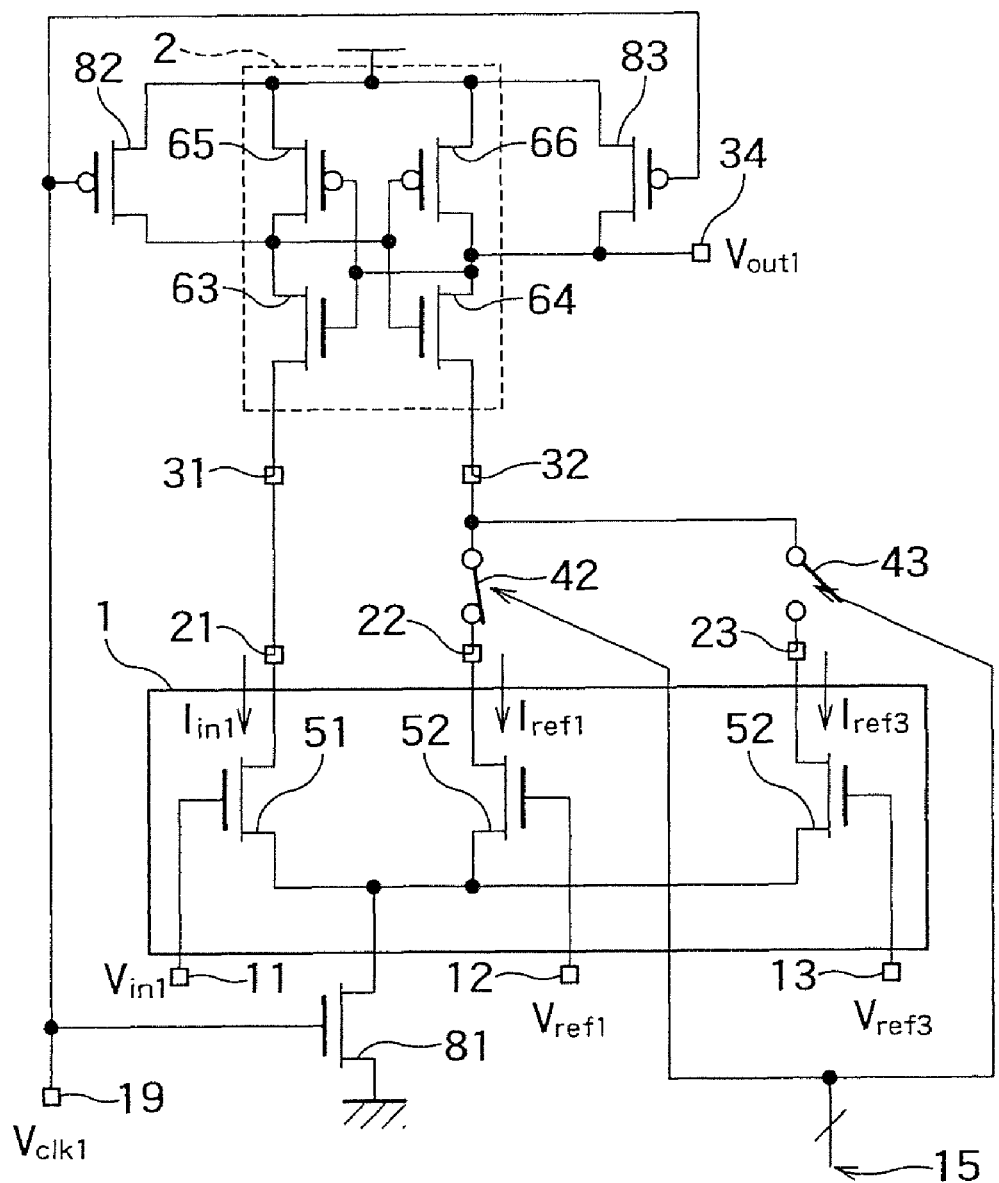
FIG. 12 is a circuit diagram illustrating a configuration example of a switch included in the comparator according to the second embodiment.

The short-circuit/open-circuit of the switches 81 to 83 are controlled by the input clock signal "Vclk1" from the clock input terminal 19. When "Vclk1" is "High", the switch 81 is short-circuited, and the switches 82 and 83 are open-circuited. When "Vclk1" is "Low", the switch 81 is open-circuited, and the switches 82 and 83 are short-circuited. The switches 81 to 83 may be obtained by configuring the switches 81 and 82 by PMOS transistors, and the switch 83 by an NMOS transistor, and inputting "Vclk1" into gate terminals as shown in FIG. 12, for example.

The transistors 63 to 66 of the output unit 2 configure a latch circuit. When "Vclk1" is "High", the magnitude relation between the currents from the input terminals 31 and 32 is compared. As a result of comparison, the voltage "Vout1" becomes the logical value "High" or "Low". When the current from the input terminal 31 is larger than the current from the input terminal 32, "Vout1" becomes "High". When the current from the input terminal 31 is smaller than the current from the input terminal 32, "Vout1" becomes "Low".

Meanwhile, when "Vclk1" is "Low", the latch circuit is reset. In the case of FIG. 12, the output terminal 34 is short-circuited with the power supply potential via the switch 83, and the output voltage "Vout1" becomes the power supply potential regardless of the previous value. Since the switch 81 is open-circuited at this time, no current is applied to the transistors 51 to 53.

Figure 13:
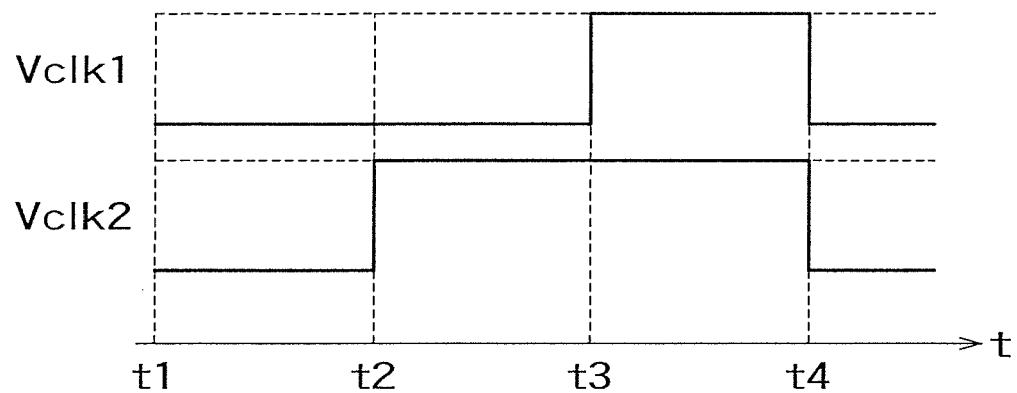
FIG. 13 is a timing diagram of clocks according to the second embodiment.

The analog-to-digital converter according to the second embodiment is operated as described below. FIG. 13 shows the timings of the clock signals "Vclk1" and "Vclk2". For example, "Vin1" is set such that 0<Vin1<Vr/2.

First, in t1 to t2, "Vclk1" and "Vclk2" are both "Low" (OFF period), and the comparators 100 and 200 are both reset.

Next, in t2 to t3, "Vclk2" becomes "High" (ON period is started), and the comparator 200 starts operation. Since Vin1>Vref2=0, the voltage "Vout2" corresponding to the logical value "High" is output from the output terminal 35. The "Vout2" is input as the control signal 15. The switch 42 is open-circuited. The switch 43 is short-circuited. "Iref3" is input into the input terminal 32 of the comparator 100.

Subsequently, in t3 to t4, "Vclk1" becomes "High" (ON period is started), and the comparator 100 starts operation. Since Vin1<Vr/2, Iin1<Iref3. Thus, the comparator 100 outputs the voltage "Vout1" corresponding to the logical value "Low". The ON period of "Vclk2" is longer than the ON period of "Vclk1". The ON period of "Vclk1" is started during the ON period of "Vclk2", and at a timing later than a timing at which the ON period of "Vclk2" is started. The ON period of "Vclk1" is terminated at the same timing as, or a timing earlier than a timing at which the ON period of "Vclk2" is terminated.

As a result, a 2-bit digital signal "10" having "Vout2" as the higher bit and "Vout1" as the lower bit is output.

In a similar manner to the first embodiment, in the binary-search analog-to-digital converter according to the present embodiment, the number of comparators connected to the input terminal 11 can be reduced. The load capacitance of the buffer circuit connected to the frontward position can be thereby reduced, so that the buffer circuit consumes less power.

When the switch 42 or the switch 43 of the comparator 100 is selected, the reference voltages "Vref1" and "Vref3" input into the input terminals 12 and 13 from the reference voltage generating circuit in FIG. 2 are constant. Therefore, a time for regulating the reference voltage is not required. The binary-search analog-to-digital converter can be thereby operated at higher speed than the SAR analog-to-digital converter in a similar manner to the conventional binary-search analog-to-digital converter.

Third Embodiment

In Which the Clocks of the Comparators are in Asynchronous Operation

Figure 14:
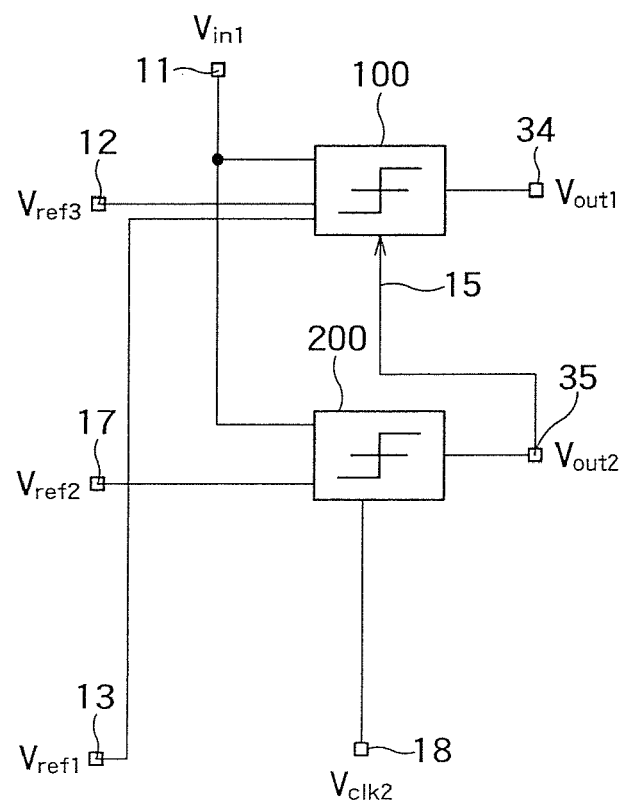
FIG. 14 is a circuit block diagram of an analog-to-digital converter according to a third embodiment.

FIG. 14 is a circuit block diagram of a binary-search analog-to-digital converter according to a third embodiment. Unlike in the second embodiment shown in FIG. 10, the comparator (the second comparator) 100 does not include the clock input terminal 19, but instead, is operated in synchronization with the control signal 15. The comparator (the first comparator) 200 is operated in synchronization with the clock "Vclk2" (the first external clock) in a similar manner to the second embodiment.

Figure 15:
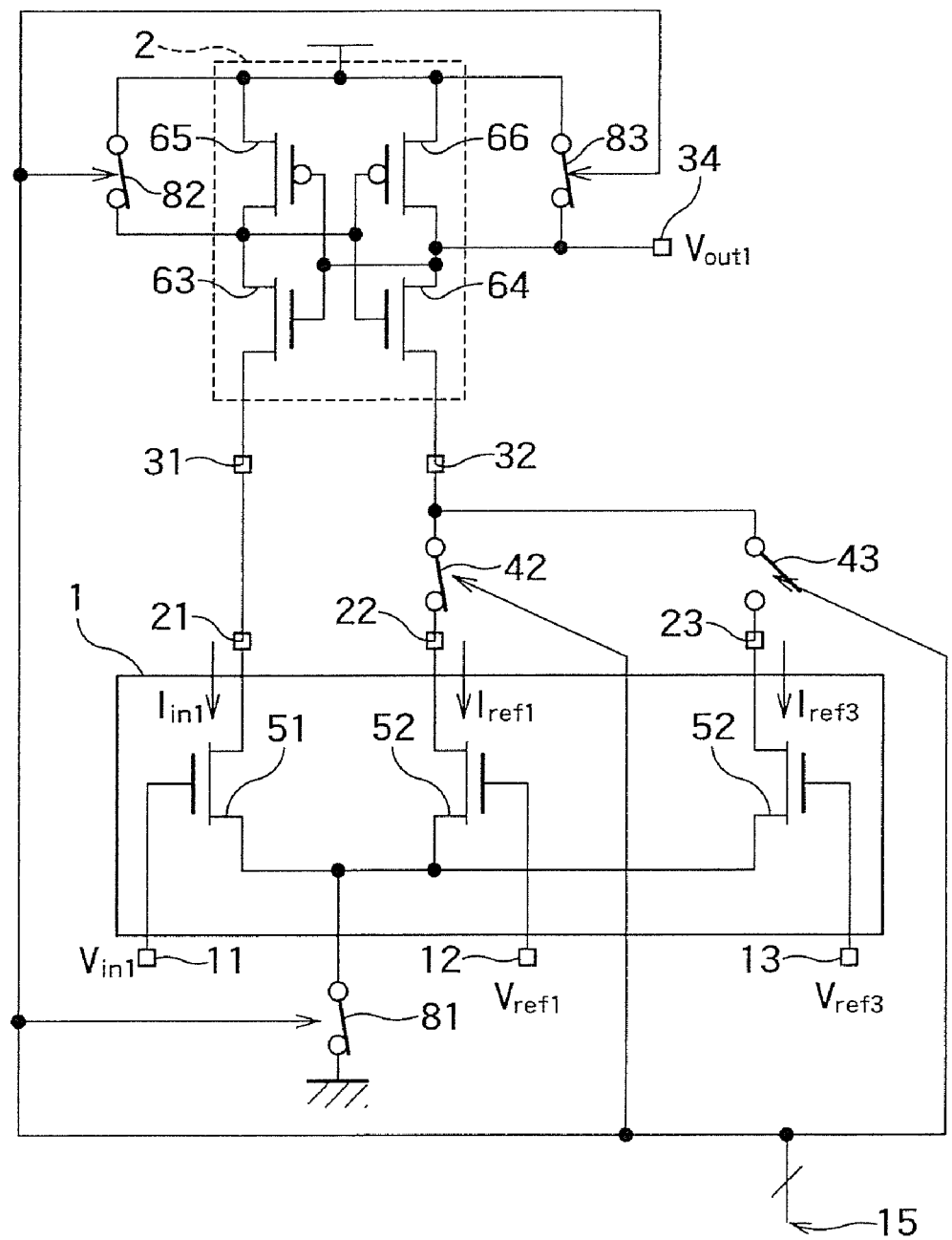
FIG. 15 is a circuit diagram of a comparator according to the third embodiment.

FIG. 15 is a circuit diagram of the comparator 100 of the binary-search analog-to-digital converter according to the third embodiment. Unlike in FIG. 11, the short-circuit/open-circuit of the switches 81 to 83 are controlled by the control signal 15. When the control signal 15 is "Low", the switches 42 and 43, and the switch 81 are open-circuited, the switches 82 and 83 are short-circuited, and the comparator 100 is reset. Meanwhile, when the control signal 15 is "High" and the comparator 100 performs the comparison operation, the switches 82 and 83 are open-circuited, and the switch 81 is short-circuited. At the same time, one of the switches 42 and 43 is short-circuited, and the other is open-circuited according to the output "Vout2" from the comparator 200.

Figure 16:
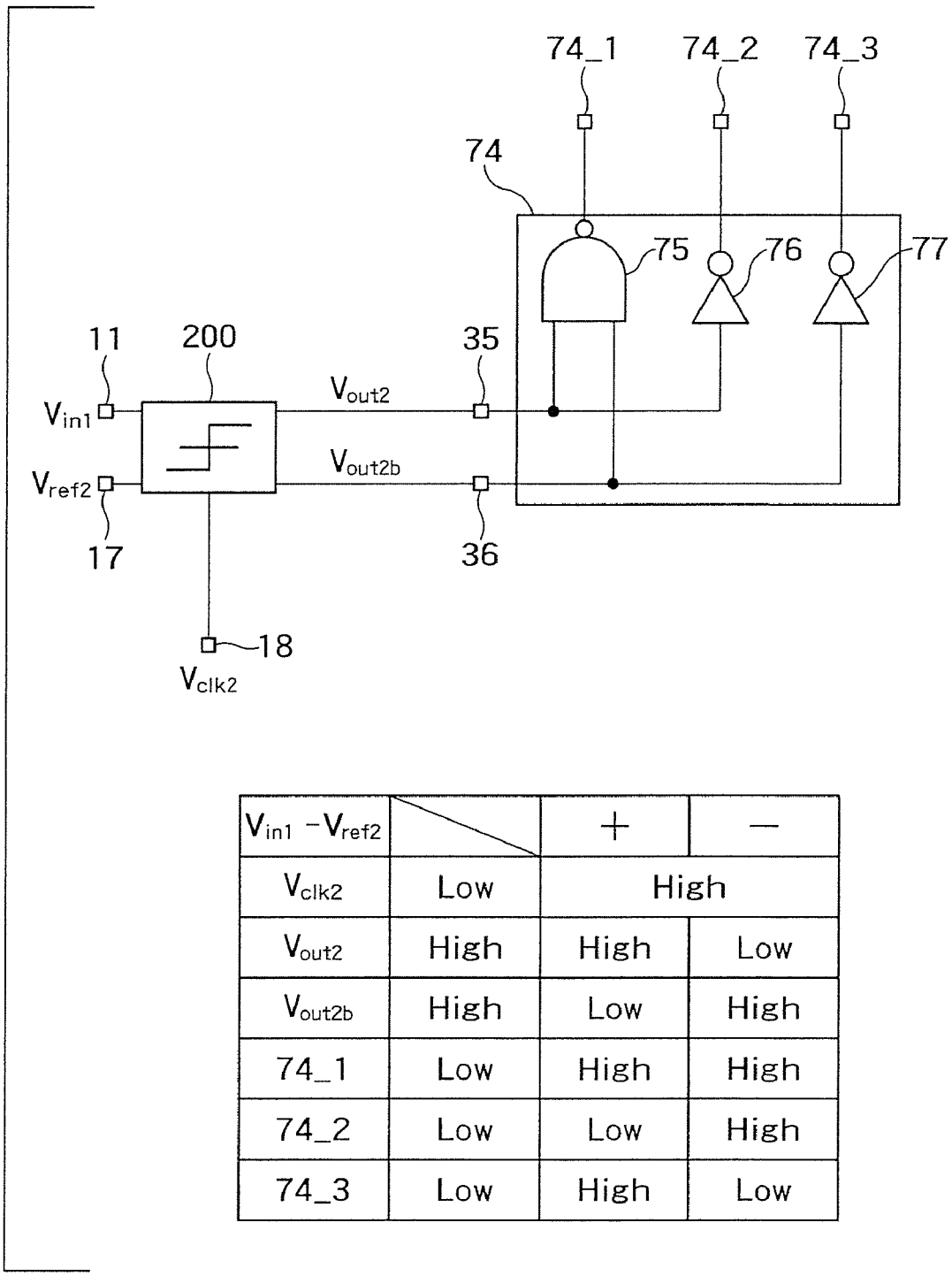
FIG. 16 is a circuit diagram of an encoder and a table showing the relation between an input signal and an output signal of the comparator according to the third embodiment.

The control by the control signal 15 can be achieved by an encoder 74 as shown in FIG. 16, for example. The comparator 200 includes the output unit 2, and the switches 82 and 83 similarly to the comparator 100 in FIG. 12. The encoder 74 is connected to a position rearward of the comparator 200. The encoder 74 includes an NAND circuit 75, and inverters 76 and 77.

An output 74_1 of the NAND circuit 75 controls the short-circuit/open-circuit of the switches 81 to 83 of the comparator 100. The switches 42 and 43 are configured by the NMOS transistors 71 and 72 as shown in FIG. 7. Outputs 74_2 and 74_3 of the inverters 76 and 77 are connected to the gate terminals of the NMOS transistors 71 and 72, to respectively control the short-circuit/open-circuit of the switches 42 and 43.

When the clock "Vclk2" is "Low" (OFF period), the voltage "Vout2" of the non-inverted output 35, and the voltage "Vout2b" of the inverted output 36 are reset to both represent "High". At the same time, the output 74_1 of the NAND circuit 75 becomes "Low", and the comparator 100 is reset. That is, the control signal that open-circuits the switches 42 and 43 and resets the output unit 2 is supplied to the comparator 100.

When the clock "Vclk2" is "High" (ON period), the comparator 200 compares the magnitude relation between "Vin1" and "Vref2". One of the voltage "Vout2" of the non-inverted output 35 and the voltage "Vout2b" of the inverted output 36 represents "High", and the other represents "Low". The outputs are inverted by the inverters 76 and 77, to control the switches 42 and 43. That is, the control signal that turns ON one of the switches 42 and 43, turns OFF the other, and causes the output unit 2 to perform the comparison operation is supplied to the comparator 100.

The operation of the analog-to-digital converter according to the present embodiment is the same as that of the second embodiment except that the comparator 100 is in synchronization with the control signal 15, not the clock signal "Vclk1".

In a similar manner to the first embodiment, in the binary-search analog-to-digital converter according to the present embodiment, the number of comparators connected to the input terminal 11 can be reduced. The load capacitance of the buffer circuit connected to the position frontward of the input terminal can be thereby reduced, so that the buffer circuit consumes less power.

When the switch 42 or the switch 43 of the comparator 100 is selected, the reference voltages "Vref1" and "Vref3" input into the input terminals 12 and 13 from the reference voltage generating circuit in FIG. 2 are constant. Therefore, a time for regulating the reference voltage is not required. The binary-search analog-to-digital converter can be thereby operated at higher speed than the SAR analog-to-digital converter in a similar manner to the conventional binary-search analog-to-digital converter.

Fourth Embodiment

Figure 17:
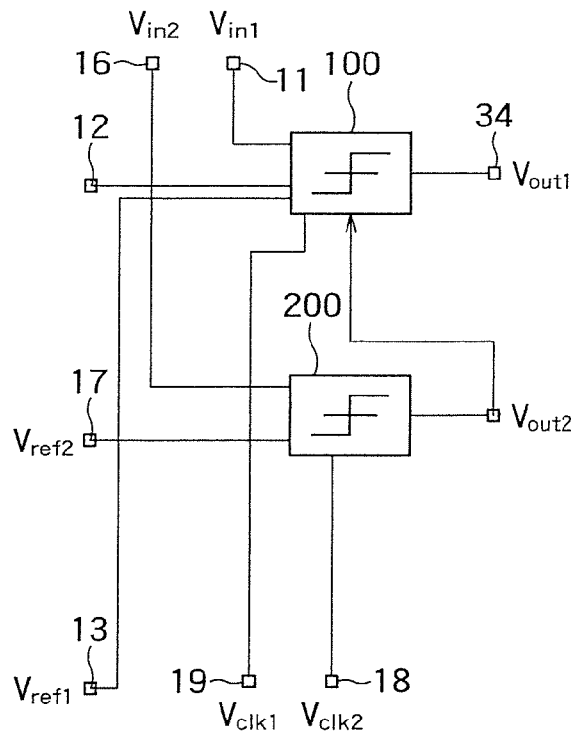
FIG. 17 is a circuit diagram of a comparator according to a fourth embodiment.

FIG. 17 is a circuit block diagram of a binary-search analog-to-digital converter according to a fourth embodiment. FIG. 17 differs from the aforementioned embodiments in that the input terminal 11 of the comparator 100 and an input terminal 16 of the comparator 200 are not short-circuited with each other. An input signal into the input terminal 11 is "Vin1", and an input signal into the input terminal 16 is "Vin2".

"Vin2" has a signal amplitude obtained by amplifying "Vin1" by K times (K>0), and it is obtained that Vin2=K*Vin1. This is achieved by giving "Vin" to the input terminal 11 as "Vin1" via an amplifier having a gain A, and "Vin" to the input terminal 16 as "Vin2" via an amplifier having a gain B (=K*A).

The operation is the same as that of the aforementioned first embodiment. First, the output "Vout2" of the comparator 200 is determined based on the magnitude relation between "Vin2" and "Vref2=0". In the circuit configuration according to the present embodiment, the input analog signal "Vin2" is multiplied K times, so that a signal-to-noise ratio is improved. There is also an advantage that the voltage "Vin2" becomes stable at high speed by reducing the influence of the parasitic capacitance of a wiring connected to the comparator 200. Since the comparator 100 is operated after the comparator 200, there is less influence from the parasitic capacitance even without amplification. In a similar manner to that described above, it may be set such that Vin1=K*Vin2, Vref3=K*Vr/2, and Vref1=−K*Vr/2 while "Vin2" is treated as in the first embodiment, so that the signal-to-noise ratio can be also improved.

In FIG. 17, the analog input signal "Vin1" is input into the single comparator. Meanwhile, in the normal binary-search analog-to-digital converter, the number of reference voltages to be possibly compared with the analog input signal "Vin1" is two: "Vref1" and "Vref3". Thus, there are two comparators into which the analog input signal "Vin1" is input in a similar manner to the flash analog-to-digital converter. Accordingly, in the binary-search analog-to-digital converter proposed herein, the number of comparators can be reduced. The load capacitance of the buffer circuit connected to the position frontward of the input signal terminal can be thereby reduced, so that the buffer circuit consumes less power.

Also, according to the present embodiment, the signal-to-noise ratio can be improved, and the operation speed can be increased in addition to the advantages of the aforementioned embodiments.

Fifth Embodiment

Figure 18:
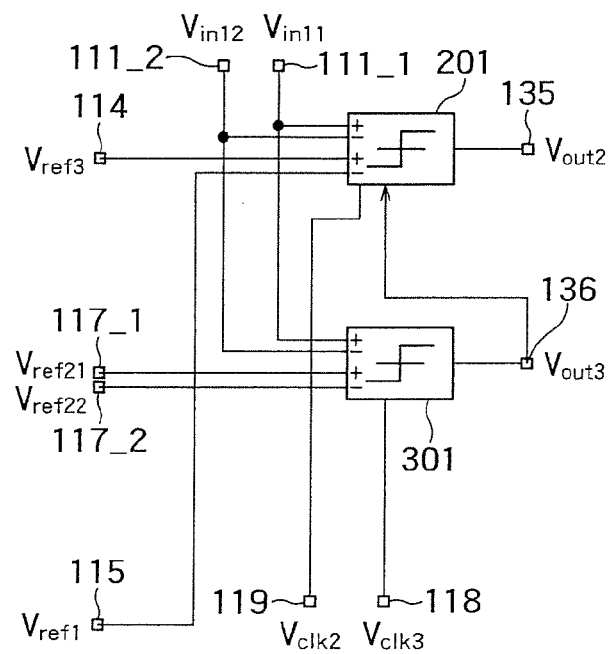
FIG. 18 is a circuit block diagram of an analog-to-digital converter according to a fifth embodiment.

FIG. 18 is a circuit block diagram of a binary-search analog-to-digital converter according to a fifth embodiment. A case of 2 bits will be described as an example.

A comparator (the second comparator) 201 includes input terminals 111_1, 111_2, 114, and 115, and an output terminal 135. Differential analog signals "Vin11" and "Vin12" are input into the input terminals 111_1 and 111_2. The reference signals "Vref3" and "Vref1" are respectively input into the input terminals 114 and 115. The input terminal 111_1 corresponds to a first input terminal, and the input terminal 111_2 corresponds to a second input terminal. The output terminal 135 outputs the output "Vout2". In a similar manner to the comparator 100 in the second embodiment (see FIG. 10), the comparator 201 performs the comparison operation when the clock "Vclk2" becomes "High", and performs the reset operation when the clock "Vclk2" becomes "Low".

A comparator (the first comparator) 301 includes the input terminals 111_1 and 111_2, input terminals 117_1 and 117_2, and an output terminal 136. Reference signals "Vref21" and "Vref22" are respectively input into the input terminals 117_1 and 117_2. The output terminal 136 outputs an output "Vout3". In a similar manner to the comparator 200 in the second embodiment (see FIG. 10), the comparator 301 performs the comparison operation when a clock "Vclk3" becomes "High", and performs the reset operation when the clock "Vclk3" becomes "Low". The same relation between "Vclk2" and "Vclk1" in FIG. 13 may be used as the relation between the clocks "Vclk3" and "Vclk2". The comparator 301 outputs a logical signal based on whether a differential "ΔVin1=Vin11−Vin12" between the analog signals "Vin11" and "Vin12" is larger than "ΔVref2=Vref21−Vref22". The comparator 301 outputs a logical signal representing "high" when "ΔVin1" is larger than "ΔVref2", and outputs a logical signal representing "low" when "ΔVin1" is smaller than "ΔVref2".

The reference signal "Vref21", "Vref22" or "ΔVref2" corresponds to a first reference signal, the reference signal "Vref3" a second reference signal, and the reference signal "Vref1" a third reference signal.

An input range of "ΔVin1=Vin11−Vin12" is set to −2Vr to 2Vr(Vr>0). "ΔVin1" corresponds to a differential signal between the two input signals. It is set such that ΔVref2=Vref21−Vref22=0. In a case of ΔVin1>=ΔVref2, the comparator 301 outputs the voltage "Vout3" corresponding to the logical value "High". In a case of ΔVin1<ΔVref2, the comparator 301 outputs the voltage "Vout3" corresponding to the logical value "Low".

Figure 19:
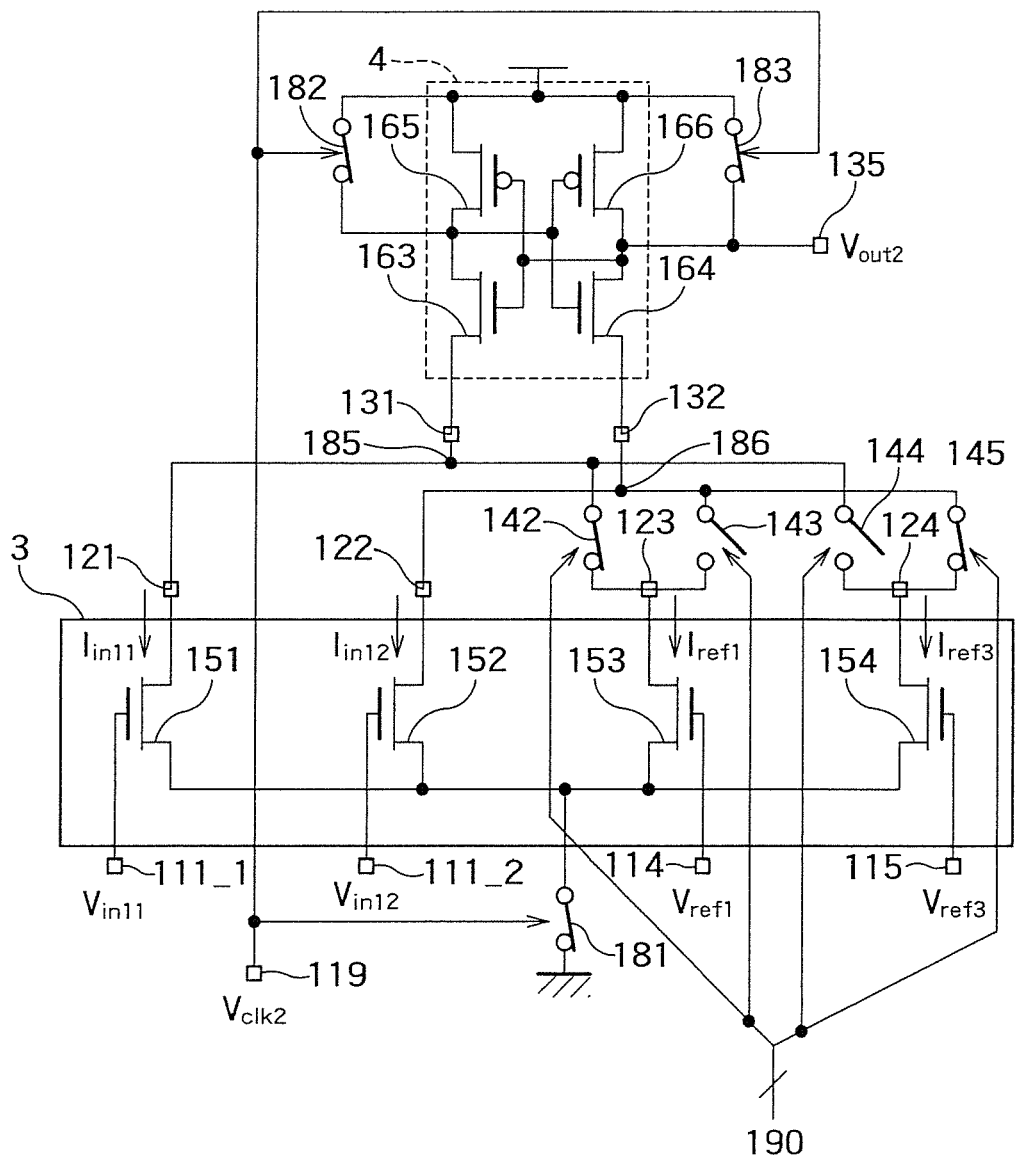
FIG. 19 is a circuit diagram of a comparator according to the fifth embodiment.

FIG. 19 is a circuit block diagram of the comparator 201. The comparator 201 includes an input unit 3, an output unit 4, switches 142 to 145, switches 181 to 183, a control signal 190, a first combining unit 185, and a second combining unit 186. The input unit 3 includes the input terminals 111_1, 111_2, 114 and 115, output terminals 121 to 124, and NMOS transistors 151 to 154. The output unit 4 includes input terminals 131 and 132, and the output terminal 135.

The switches 142 to 145 are respectively connected between the output terminal 123 and the input terminal 131, the output terminal 123 and the input terminal 132, the output terminal 124 and the input terminal 131, and the output terminal 124 and the input terminal 132. The switch 142 corresponds to a first switch, the switch 143 a second switch, the switch 144 a third switch, and the switch 145 a fourth switch.

The switches 142 to 145 are short-circuited/open-circuited according to the control signal from the comparator 301. The switch 142 is switched so as to be short-circuited/open-circuited in the same manner as the switch 145. The switch 143 is switched so as to be short-circuited/open-circuited in the same manner as the switch 144. That is, when the switch 142 is ON, the switches 143 and 144 are OFF, and the switch 145 is ON. When the switch 142 is OFF, the switches 143 and 144 are ON, and the switch 145 is OFF.

The NMOS transistors 151 to 154 respectively output drain currents "Iin11", "Iin12", "Iref1", and "Iref3" based on the gate voltages "Vin11", "Vin12", "Vref1", and "Vref3". The NMOS transistor 151 corresponds to a first transistor, the NMOS transistor 152 a second transistor, the NMOS transistor 153 a third transistor, and the NMOS transistor 154 a fourth transistor.

The first combining unit 185 is connected to the other ends of the switches 142 and 144, and electrically connected to one end of the NMOS transistor 151 via the output terminal 121. The combining unit 185 combines a current generated by the NMOS transistor 151 and a current generated by one of the NMOS transistor 153 and the NMOS transistor 154. To be more specific, when the switch 142 is ON and the switch 144 is OFF, the current generated by the NMOS transistor 151 is combined with the current generated by the NMOS transistor 153. When the switch 142 is OFF and the switch 144 is ON, the current generated by the NMOS transistor 151 is combined with the current generated by the NMOS transistor 154. The first combining unit 185 supplies a current obtained by combining the two currents to the input terminal 131.

The second combining unit 186 is connected to the other ends of the switches 143 and 145, and electrically connected to one end of the NMOS transistor 152 via the output terminal 122. The second combining unit 186 combines a current generated by the NMOS transistor 152 and a current generated by one of the NMOS transistor 153 and the NMOS transistor 154. To be more specific, when the switch 143 is ON and the switch 145 is OFF, the current generated by the NMOS transistor 152 is combined with the current generated by the NMOS transistor 153. When the switch 143 is OFF and the switch 145 is ON, the current generated by the NMOS transistor 152 is combined with the current generated by the NMOS transistor 154. The second combining unit 186 supplies a current obtained by combining the two currents to the input terminal 132.

The output unit 4 generates a logical signal by comparing the current supplied to the input terminal 131, and the current supplied to the input terminal 132. The output unit 4 outputs the logical signal as the voltage "Vout2" from the output terminal 135.

It is set such that $\Delta \text{Iin1}=\text{Iin11}-\text{Iin12}$. In the comparison operation, source terminals of the NMOS transistors 151 to 154 are connected to the ground potential via the switch 181. Thus, the magnitude of "$\Delta \text{Iin1}$" monotonically increases with respect to the magnitude of "$\Delta \text{Vin1}$".

In a case in which the voltages "Vref1" and "Vref3" are set such that $\Delta \text{Iin1}=\text{Iref3}-\text{Iref1}$ when $\Delta \text{Vin1}=\text{Vr}$,
  $\Delta \text{Iin1}>\text{Iref3}-\text{Iref1}$ when $2\text{Vr}>=\Delta \text{Vin1}>\text{Vr}$, and
  $\Delta \text{Iin1}<\text{Iref3}-\text{Iref1}$ when $\text{Vr}>=\Delta \text{Vin1}>0$.

Also, since "$\Delta \text{Vin1}$" is a differential, and
in a case in which $\Delta \text{Iin1}=\text{Iref1}-\text{Iref3}$ when $\Delta \text{Vin1}=-\text{Vr}$,
  $\Delta \text{Iin1}<\text{Iref1}-\text{Iref3}$ when $-2\text{Vr}<=\Delta \text{Vin1}<-\text{Vr}$, and
  $\Delta \text{Iin1}>\text{Iref1}-\text{Iref3}$ when $-\text{Vr}<=\Delta \text{Vin1}<0$.

As an example of numerical values to facilitate understanding, "Vr" may be 1, "Vref3" may be 0.5, and "Vref1" may be −0.5. The outline of the operation at this point will be described. The comparator 301 determines the higher bit as 0 or 1 based on whether "$\Delta \text{Vin1}$" is larger than 0. The comparator 201 selects one threshold value from +1 and −1 based on the comparison result of the comparator 301. The comparator 201 thereby checks whether "$\Delta \text{Vin1}$" is larger than the threshold value, and determines the lower bit as 0 or 1 (the detailed operation will be described below).

The short-circuit/open-circuit of the switches 142 to 145 are determined by the control signal 190. The control signal 190 is defined by the voltage "Vout3" from the output terminal 136 of the comparator 301. In a case of Vout3=High, the switches 142 and 145 are open-circuited, and the switches 143 and 144 are short-circuited. Meanwhile, in a case of Vout3=Low, the switches 143 and 144 are open-circuited, and the switches 142 and 145 are short-circuited.

The analog-to-digital converter according to the present embodiment is operated as described below. For example, "$\Delta \text{Vin1}$" is set such that $-\text{Vr}<\Delta \text{Vin1}<0$. First, the comparator 301 is operated. Since $\Delta \text{Vin1}<\Delta \text{Vref2}=0$, the voltage "Vout3" corresponding to the logical value "Low" is output from the output terminal 136. When the "Vout3" is input into the comparator 201 as the control signal 190, the switches 143 and 144 are open-circuited, and the switches 142 and 145 are short-circuited. "Iin11+Iref1" is input into the input terminal 131. "Iin12+Iref3" is input into the input terminal 132. The output unit 4 compares the magnitude relation between "Iin11+Iref1" and "Iin12+Iref3". As a result of comparison, $\Delta \text{Iin1}-(\text{Iref1}-\text{Iref3})>0$, so that the voltage "Vout2" from the output 135 represents "High". As a result, a 2-bit digital signal "01" having "Vout3" as the higher bit and "Vout2" as the lower bit is output.

For example, "$\Delta \text{Vin1}$" is set such that $0<\Delta \text{Vin1}<\text{Vr}$. First, the comparator 301 is operated. Since $\Delta \text{Vin1}>\Delta \text{Vref2}=0$, the voltage "Vout3" representing the logical value "High" is output from the output terminal 136. When the "Vout3" is input into the comparator 201 as the control signal 190, the switches 142 and 145 are open-circuited, and the switches 143 and 144 are short-circuited. "Iin11+Iref3" is input into the input terminal 131. "Iin12+Iref1" is input into the input terminal 132. The output unit 4 compares the magnitude relation between "Iin11+Iref3" and "Iin12+Iref1". As a result of comparison, $\Delta \text{Iin1}-(\text{Iref3}-\text{Iref1})<0$, so that the voltage "Vout2" from the output 135 corresponds to the logical value "Low". As a result, a 2-bit digital signal "10" having "Vout3" as the higher bit and "Vout2" as the lower bit is output.

Similarly, when $-2\text{Vr}<=\Delta \text{Vin1}<-\text{Vr}$, a digital signal "00" is output. When $\text{Vr}<\Delta \text{Vin}<=2\text{Vr}$, a digital signal "11" is output. Through the above process, the input analog signal "$\Delta \text{Vin1}$" is converted into a digital signal, and output.

In FIG. 18, there are two comparators which are connected to the input terminals 111_1 and 111_2 into which the analog input signals "Vin11" and "Vin12" are input. Meanwhile, in the normal binary-search analog-to-digital converter, three comparators are configured to be connected to the input terminals 111_1 and 111_2 in the case of 2 bits. Accordingly, in the binary-search analog-to-digital converter proposed herein, the number of comparators connected to the input terminals can be reduced. The load capacitance of the buffer circuit connected to the frontward position can be thereby reduced, so that the buffer circuit consumes less power.

When the switches 142, 143, 144, and 145 of the comparator 201 are selected, the reference voltages "Vref1" and "Vref3" input into the input terminals 114 and 115 are constant. Therefore, a time for regulating the reference voltage is not required. The binary-search analog-to-digital converter can be thereby operated at higher speed than the SAR analog-to-digital converter in a similar manner to the conventional binary-search analog-to-digital converter.

Furthermore, as shown in FIG. 18, in the conventional binary-search analog-to-digital converter, each of the reference voltages "Vref1" and "Vref3" is input into the two comparators. Meanwhile, in the binary-search analog-to-digital converter proposed herein, both the reference voltages are input into the single comparator. The number of NMOS transistors of the comparator 201 connected to the reference voltage generating circuit is thus reduced. As a result, kickback noise via the overlap capacitance of the transistor can be reduced, and higher resolution obtained.

Sixth Embodiment

Figure 20:
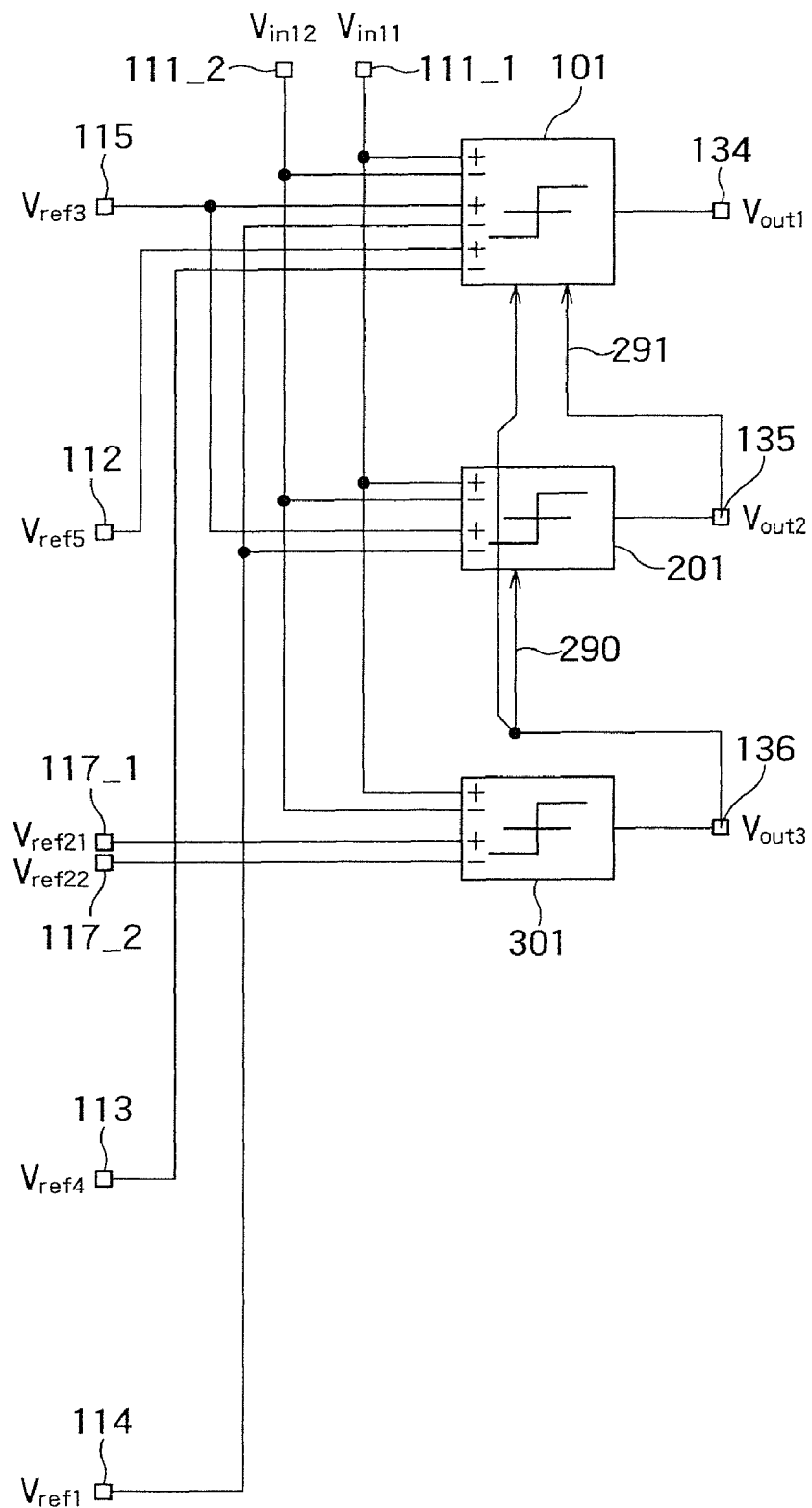
FIG. 20 is a circuit block diagram of an analog-to-digital converter according to a sixth embodiment.

FIG. 20 is a circuit block diagram of a binary-search analog-to-digital converter according to a sixth embodiment. Although the example of 2 bits is described in the fifth embodiment, a case of 3 bits will be described in the present embodiment.

The comparators 201 and 301 have the same circuit configuration as that of the fifth embodiment. The comparator 101 is also added thereto. As shown in FIG. 20, the comparator 101 includes input terminals 111_1, 111_2, and 112 to 115, and an output terminal 134. The analog differential signals "Vin11" and "Vin12" are input into the input terminals 111_1 and 111_2 respectively. Reference signals "Vref5" and "Vref4" are respectively input into the input terminals 112 and 113. The output terminal 134 outputs the output "Vout1".

Figure 21:
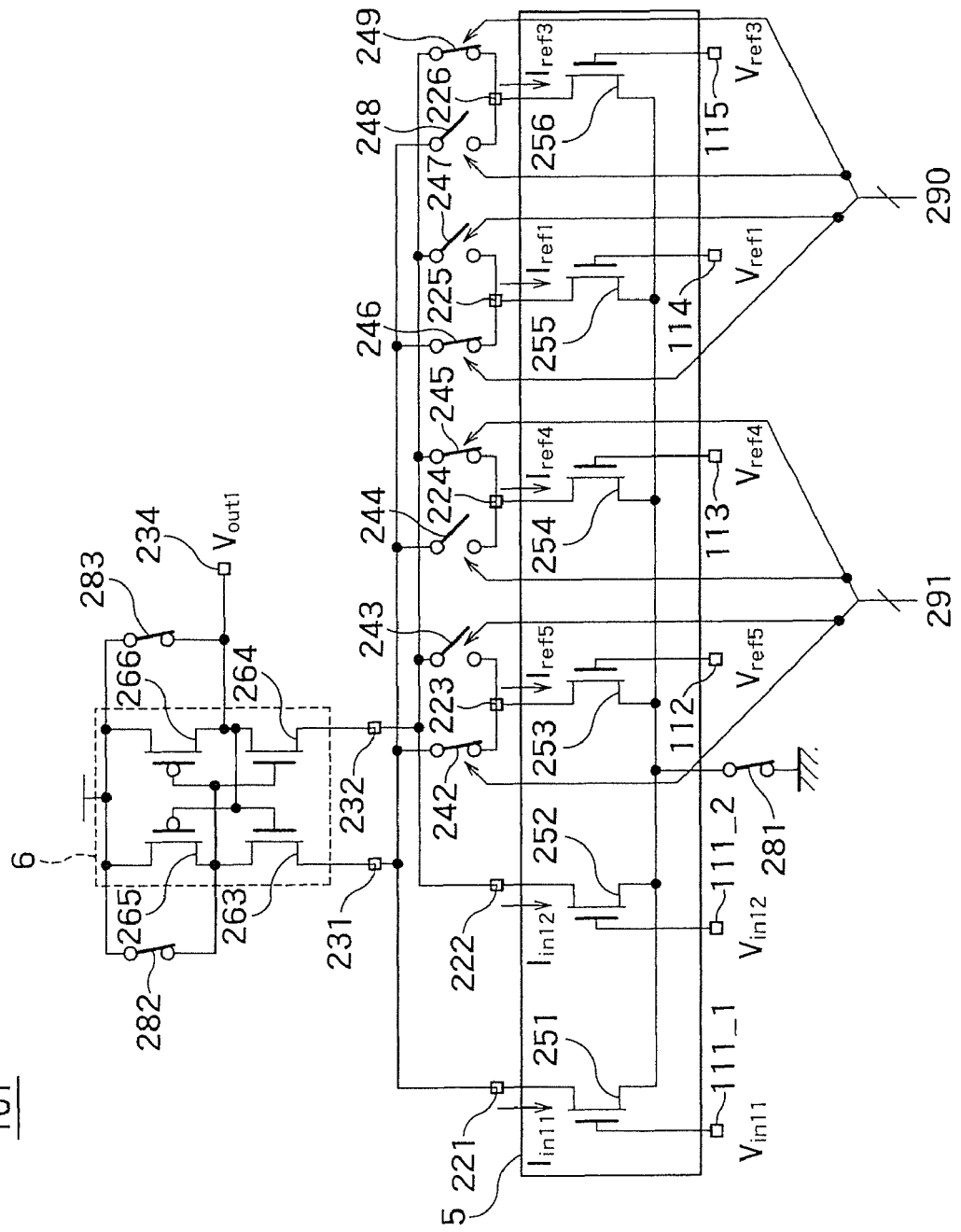
FIG. 21 is a circuit diagram of a comparator according to the sixth embodiment.

FIG. 21 is a circuit block diagram of the comparator 101. The comparator 101 includes an input unit 5, an output unit 6, switches 242 to 249, switches 281 to 283, and control signals 290 and 291. The input unit 5 includes the input terminals 111_1, 111_2, and 112 to 115, output terminals 221 to 226, and NMOS transistors 251 to 256. The output unit 6 includes input terminals 231 and 232, and an output terminal 234.

The switches 242 to 249 are respectively connected between the output terminal 223 and the input terminal 231, the output terminal 223 and the input terminal 232, the output terminal 224 and the input terminal 231, the output terminal 224 and the input terminal 232, the output terminal 225 and the input terminal 231, the output terminal 225 and the input terminal 232, the output terminal 226 and the input terminal 231, and the output terminal 226 and the input terminal 232.

The NMOS transistors 251 to 256 respectively output drain currents "Iin11", "Iin12", "Iref5", "Iref4", "Iref1", and "Iref3" based on the magnitudes of the input voltages "Vin11", "Vin12", "Vref5", "Vref4", "Vref1", and "Vref3" into gate terminals from the output terminals 221 to 226. Since source terminals of the NMOS transistors 251 and 252 are connected to the ground potential in the comparison operation, the magnitude of "$\Delta$Iin1" monotonically increases with respect to the magnitude of "$\Delta$Vin1".

In a case in which the voltages "Vref1" and "Vref3" are set such that $\Delta$Iin1=Iref3−Iref1 when $\Delta$Vin1=Vr, $\Delta$Iin1>Iref3−Iref1 when 2Vr>=$\Delta$Vin1>Vr, and $\Delta$Iin1<Iref3−Iref1 when Vr>=$\Delta$Vin1>0.

Also, in a case in which $\Delta$Iin1=Iref1−Iref3 when $\Delta$Vin1=−Vr, $\Delta$Iin1<Iref1−Iref3 when −2Vr<=$\Delta$Vin1<−Vr, and $\Delta$Iin1>Iref1−Iref3 when −Vr<=$\Delta$Vin1<0.

In a case in which the voltages "Vref4" and "Vref5" are set such that $\Delta$Iin1−(Iref3−Iref1)=Iref5−Iref4 when $\Delta$Vin1=3Vr/2, $\Delta$Iin1−(Iref3−Iref1)>Iref5−Iref4 when 2Vr>=$\Delta$Vin1>3Vr/2, and $\Delta$Iin1−(Iref3−Iref1)<Iref5−Iref4 when 3Vr/2>=$\Delta$Vin1>Vr.

Also, in a case in which $\Delta$Iin1−(Iref3−Iref1)=Iref4−Iref5 when $\Delta$Vin1=Vr/2, $\Delta$Iin1−(Iref3−Iref1)>Iref4−Iref5 when Vr<=$\Delta$Vin1<Vr/2, and $\Delta$Iin1−(Iref3−Iref1)<Iref4−Iref5 when Vr/2<=$\Delta$Vin1<0.

Similarly, $\Delta$Iin1−(Iref1−Iref3)>Iref5−Iref4 when −Vr/2<=$\Delta$Vin1<0, $\Delta$Iin1−(Iref1−Iref3)<Iref5−Iref4 when −Vr<=$\Delta$Vin1<−Vr/2, $\Delta$Iin1−(Iref1−Iref3)>Iref4−Iref5 when −3Vr/2<=$\Delta$Vin1<−Vr, and $\Delta$Iin1−(Iref1−Iref3)<Iref4−Iref5 when 2Vr<=$\Delta$Vin1<−3Vr/2.

As an example of numerical values, "Vr" may be 1, "Vref3" may be 0.5, "Vref5" may be 0.25, Vref21=Vref22=0, "Vref4" may be −0.25, and "Vref1" may be −0.5. The outline of the operation at this point will be described. The comparator 301 determines the highest bit as 0 or 1 based on whether "$\Delta$Vin1" is larger than 0. The comparator 201 selects one threshold value from +1 and −1 based on the comparison result of the comparator 301. The comparator 201 thereby checks whether "$\Delta$Vin1" is larger than the selected value, and determines the middle bit as 0 or 1. The comparator 101 selects one threshold value from 1.5, 0.5, −0.5, and −1.5 based on the comparison results of the comparators 301 and 201. The comparator 101 thereby checks whether "$\Delta$Vin1" is larger than the threshold value, and determines the lowest bit as 0 or 1.

The output unit 6 performs the comparison operation when the clock "Vclk1" becomes "High". The output unit 6 compares the magnitude relation between the currents input from the input terminals 231 and 232, and outputs the comparison result as the voltage "Vout1" corresponding to the logical value "High"/"Low". The output unit 6 performs the reset operation when the clock "Vclk1" becomes "Low".

The control signal 290 is defined by the logical value of the output signal "Vout3" from the output terminal 136 of the comparator 301, to control the short-circuit/open-circuit of the switches 246 to 249. In a case of Vout3=High, the switches 246 and 249 are open-circuited, and the switches 247 and 248 are short-circuited. Meanwhile, in a case of Vout3=Low, the switches 247 and 248 are open-circuited, and the switches 246 and 249 are short-circuited.

The control signal 291 is defined by the logical value of the output signal "Vout2" from the output terminal 135 of the comparator 201, to control the short-circuit/open-circuit of the switches 242 to 245. In a case of Vout2=High, the switches 242 and 245 are open-circuited, and the switches 243 and 244 are short-circuited. Meanwhile, in a case of Vout2=Low, the switches 243 and 244 are open-circuited, and the switches 242 and 245 are short-circuited.

The analog-to-digital converter according to the present embodiment is operated as described below. For example, "$\Delta$Vin1" is set such that −Vr/2<$\Delta$Vin1<0. First, the comparator 301 is operated. Since $\Delta$Vin1<$\Delta$Vref2=0, the voltage "Vout3" representing the logical value "Low" is output from the output terminal 136. As shown in FIG. 21, the "Vout3" is input into both the comparators 101 and 201 as the control signal 290. The voltage "Vout2" from the output 135 of the comparator 201 represents "High". When the "Vout2" is input into the comparator 101 as the control signal 291, "Iin11+Iref5+Iref1" is input into the input terminal 231, and "Iin12+Iref4+Iref3" is input into the input terminal 232 as shown in FIG. 21. The comparator 101 performs the comparison operation when the clock signal "Vclk1" is "High". Since $-Vr/2<\Delta Vin1<0$, $\Delta Iin1-(Iref1-Iref3)-(Iref5-Iref4)>0$ as a result of comparison. The voltage "Vout1" corresponding to the logical value "High" is output from the output terminal 134. As a result, a 3-bit digital signal "011" having "Vout3" as the highest bit and "Vout1" as the lowest bit is output.

In FIG. 20, there are three comparators which are connected to the input terminals 111_1 and 111_2 into which the analog input signals "Vin11" and "Vin12" are input. Meanwhile, in the normal binary-search analog-to-digital converter, seven comparators are connected to the input terminals 111_1 and 111_2 in the case of 3 bits. Accordingly, in the binary-search analog-to-digital converter proposed herein, the number of comparators connected to the input terminals can be reduced. The load capacitance of the buffer circuit connected to the position frontward of the input terminal can be thereby reduced, so that the buffer circuit consumes less power.

When the comparators 101 to 301 start the comparison operation, the reference voltages "Vref1" and "Vref3" to "Vref5" are constant. Therefore, a time for regulating the reference voltage is not required. The binary-search analog-to-digital converter can be thereby operated at higher speed than the SAR analog-to-digital converter in a similar manner to the conventional binary-search analog-to-digital converter.

Furthermore, in the conventional binary-search analog-to-digital converter, seven reference voltages: "±3Vr/2", "±Vr", "±Vr/2" and "0" are required. Meanwhile, in the binary-search analog-to-digital converter proposed herein, only five reference voltages: "Vref1" to "Vref5" are required. Thus, the number of reference voltage generating circuits, and the number of wirings between the reference voltage generating circuits and the comparators can be reduced. The circuit can be thereby simplified.

The analog-to-digital converter according to the respective embodiments described above may be applied to a subranging analog-to-digital converter, for example, so that the power consumption of an input buffer can be reduced.

The present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

What is claimed is:

1. An analog-to-digital converter comprising:
an input terminal configured to receive an input signal;
a first comparator configured to generate a first logical signal and a control signal by comparing the input signal with a first reference signal;
a first output terminal configured to output the first logical signal;
a second comparator configured to generate a second logical signal based on the input signal, a second reference signal, a third reference signal, and the control signal; and
a second output terminal configured to output the second logical signal,
the second comparator comprising:
a terminal;
a first transistor configured to generate a first current based on the input signal;
a first switch configured to be short-circuited and open-circuited according to the control signal;
a second switch configured to be switched so as to be short-circuited and open-circuited in an opposite manner to the first switch according to the control signal;
a second transistor configured to supply a second current based on the second reference signal to the terminal when the first switch is ON;
a third transistor configured to supply a third current based on the third reference signal to the terminal when the second switch is ON
wherein one end of the first switch is connected to the terminal, one end of the second switch is connected to the terminal, one end of the second transistor is connected to the other end of the first switch, and one end of the third transistor is connected to the other end of the second switch; and
an output unit configured to generate the second logical signal by comparing the first current with one of the second current and the third current supplied to the terminal.

2. The converter according to claim 1,
wherein a voltage based on the second reference signal is applied to a gate of the second transistor, and
a voltage based on the third reference signal is applied to a gate of the third transistor.

3. The converter according to claim 1,
wherein the other end of the second transistor is connected to a predetermined potential via a first constant-current source,
the other end of the third transistor is connected to the predetermined potential via a second constant-current source,
a constant voltage is applied to gates of the second and third transistors,
the second current is supplied to the other end of the second transistor, and
the third current is supplied to the other end of the third transistor.

4. The converter according to claim 1,
wherein the first comparator operates according to a first external clock so as to perform a comparison operation during an ON period of the first external clock and stop the comparison operation during an OFF period of the first external clock,
the output unit of the second comparator operates according to a second external clock so as to perform a comparison operation during an ON period of the second external clock and stop the comparison operation during an OFF period of the second external clock, and
the ON period of the second external clock starts during the ON period of the first external clock, and at a timing later than a timing at which the ON period of the first external clock starts.

5. The converter according to claim 1,
wherein the first comparator operates according to a first external clock, generates a control signal to turn OFF the first and second switches when the first external clock is in an OFF period, and generates the control signal to turn ON one of the first and second switches and turn OFF the other switch when the first external dock is in an ON period.

6. The converter according to claim 1,
wherein an amplified signal of the input signal is applied to the first comparator, and the first comparator compares the amplified signal with the first reference signal.

7. An analog-to-digital converter comprising:
an input terminal configured to receive a first input signal;
a second input terminal configured to receive a second input signal;
a first comparator configured to generate a first logical signal and a control signal by comparing a differential signal between the first input signal and the second input signal with a first reference signal;
a first output terminal configured to output the first logical signal;
a second comparator configured to generate a second logical signal based on the first input signal, the second input signal, a second reference signal, a third reference signal, and the control signal; and
a second output terminal configured to output the second logical signal,
the second comparator comprising:
a first transistor configured to generate a first current based on the first input signal;
a second transistor configured to generate a second current based on the second input signal;
a first switch configured to be short-circuited and open-circuited according to the control signal;
a second switch configured to be switched so as to be short-circuited and open-circuited in an opposite manner to the first switch according to the control signal;
a third switch configured to be switched so as to be short-circuited and open-circuited in an opposite manner to the first switch according to the control signal;
a fourth switch configured to be switched so as to be short-circuited and open-circuited in same manner as the first switch according to the control signal;
a third transistor configured to generate a third current based on the second reference signal when one of the first switch and the second switch is ON;
a fourth transistor configured to generate a fourth current based on the third reference signal when one of the third switch and the fourth switch is ON;
a first combining unit configured to combine the first current with one of the third current and the fourth current;
a second combining unit configured to combine the second current with one of the third current and the fourth current
wherein one end of the third transistor is connected to one ends of the first switch and the second switch, one end of the fourth transistor is connected to one ends of the third switch and the fourth switch, the first combining unit is connected to the other ends of the first switch and the third switch and one end of the first transistor electrically, and the second combining unit is connected to the other ends of the second switch and the fourth switch and one end of the second transistor electrically; and
an output unit configured to generate the second logical signal by comparing a first combined current obtained by the first combining unit with a second combined current obtained by the second combining unit.

8. The converter according to claim 7,
wherein a voltage based on the second reference signal is applied to a gate of the third transistor, and
a voltage based on the third reference signal is applied to a gate of the fourth transistor.

9. The converter according to claim 7,
wherein the other end of the third transistor is connected to a predetermined potential via a first constant-current source,
the other end of the fourth transistor is connected to the predetermined potential via a second constant-current source,
a constant voltage is applied to gates of the third and fourth transistors,
the third current is supplied to the other end of the third transistor, and
the fourth current is supplied to the other end of the fourth transistor.

10. The converter according to claim 7,
wherein the first comparator operates according to a first external clock so as to perform a comparison operation during an ON period of the first external clock and stop the comparison operation during an OFF period of the first external clock,
the output unit of the second comparator operates according to a second external clock so as to perform a comparison operation during an ON period of the second external clock and stop the comparison operation during an OFF period of the second external clock, and
the ON period of the second external clock starts during the ON period of the first external clock, and at a timing later than a timing at which the ON period of the first external clock starts.

11. The converter according to claim 7,
wherein the first comparator operates according to a first external clock,
generates a control signal to turn OFF the first, second, third and fourth switches when the first external clock is in an OFF period, and
generates the control signal to turn ON one of the first and third switches and turn OFF the other of the first and third switches, and turn ON one of the second and fourth switches and turn OFF the other switch of the second and fourth switches, when the first external clock is in an ON period.

* * * * *